(12) United States Patent
Puech et al.

(10) Patent No.: US 7,938,907 B2
(45) Date of Patent: May 10, 2011

(54) DEVICE FOR FABRICATING A MASK BY PLASMA ETCHING A SEMICONDUCTOR SUBSTRATE

(75) Inventors: Michel Puech, Metz-Tessy (FR); Martial Chabloz, Urayasu (JP)

(73) Assignee: Alcatel, Paris (FR)

( * ) Notice: Subject to any disclaimer, the term of this patent is extended or adjusted under 35 U.S.C. 154(b) by 375 days.

(21) Appl. No.: 11/319,630

(22) Filed: Dec. 29, 2005

(65) Prior Publication Data
US 2006/0148274 A1 Jul. 6, 2006

(30) Foreign Application Priority Data

Jan. 3, 2005 (FR) .................... 05 50002

(51) Int. Cl.
C23C 16/00 (2006.01)
C23C 14/00 (2006.01)
C25B 11/00 (2006.01)
H01L 21/425 (2006.01)
B44C 1/22 (2006.01)
C23C 16/04 (2006.01)

(52) U.S. Cl. ........ 118/720; 118/504; 118/721; 118/505; 156/345.19; 156/345.23; 156/345.3; 156/345.51

(58) Field of Classification Search ........... 118/720, 118/504, 721
See application file for complete search history.

(56) References Cited

U.S. PATENT DOCUMENTS 3,887,421 A * 6/1975 Hudson et al. ............... 156/280
6,531,249 B1 3/2003 Katakura
6,960,263 B2 * 11/2005 Tanaka et al. ................ 118/720

FOREIGN PATENT DOCUMENTS
EP 0 786 804 A2 7/1997

OTHER PUBLICATIONS

Il-Yong Jong et al, Development of etch rate uniformity adjustment technology for photomask quartz etch in manufacturing the 100% attenuated PSM, Proceedings of the SPIE—The International Society for Optical Engineering SPIE—Int. Soc. Opt. Eng. USA, vol. 5130, No. 1, Aug. 26, 2003, pp. 246-252, XP002345112.
I. R. Johnston et al, "Etching 200-mm diameter Scalpel® masks with the ASE(R ) process", Proceedings of the SPIE—The International Society for Optical Engineering SPIE—Int. Soc. Opt. Eng, USA, vol. 3997, 2000, pp. 184-193.

(Continued)

Primary Examiner — Rudy Zervigon
(74) Attorney, Agent, or Firm — Sughrue Mion, PLLC

(57) ABSTRACT

A device for fabricating a mask by plasma etching a semiconductor substrate comprises a semiconductor substrate part of the area whereof is partially covered by a mask for protecting at least one area that must not be etched and for exposing at least one area including a pattern to be etched, a support for the substrate and means for generating a plasma in the form of a flow of ions toward the substrate. According to the invention the device further comprises means for confining the ions, including a conductive material screen disposed over the substrate and along the limit between the pattern area to be etched and the area not to be etched.

15 Claims, 3 Drawing Sheets

OTHER PUBLICATIONS

W. J. Dauksher et al, "Modeling and development of a deep silicon etch process for 200 mm election projection lithography mask fabrication", Journal of Vacuum Science & Technology B (Microelectronics and Nanometer Structures) AIP for American Vacuum Soc., USA, Vol. 19, No. 6 Nov. 2001, pp. 2921-2925, XP002345114.

W. J. Dauksher et al, "Modeling and experimental data using a new high rate ICP tool for dry etching 200 mm EPL masks", Microelectronic Engineering Elsevier Netherlands, vol. 61-62, Jul. 2002, pp. 887-894, XP002345115.

* cited by examiner

FIG_1
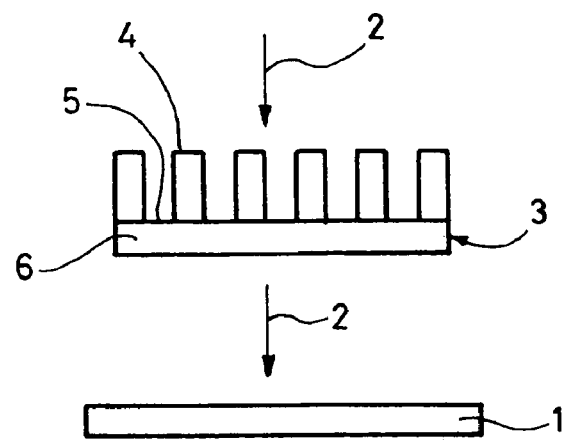
FIG_2
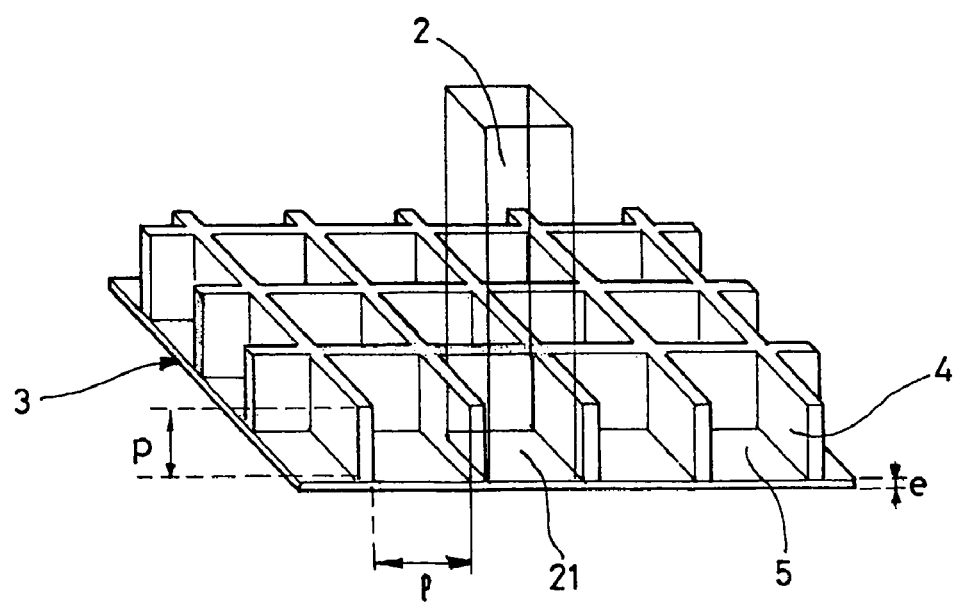

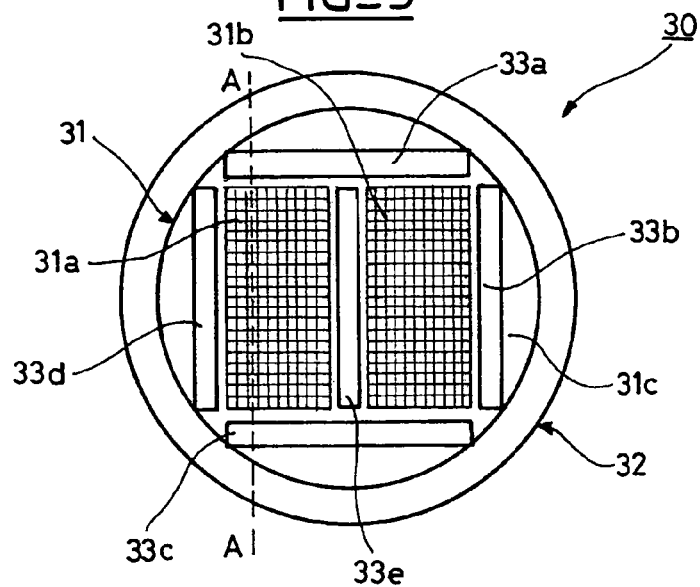
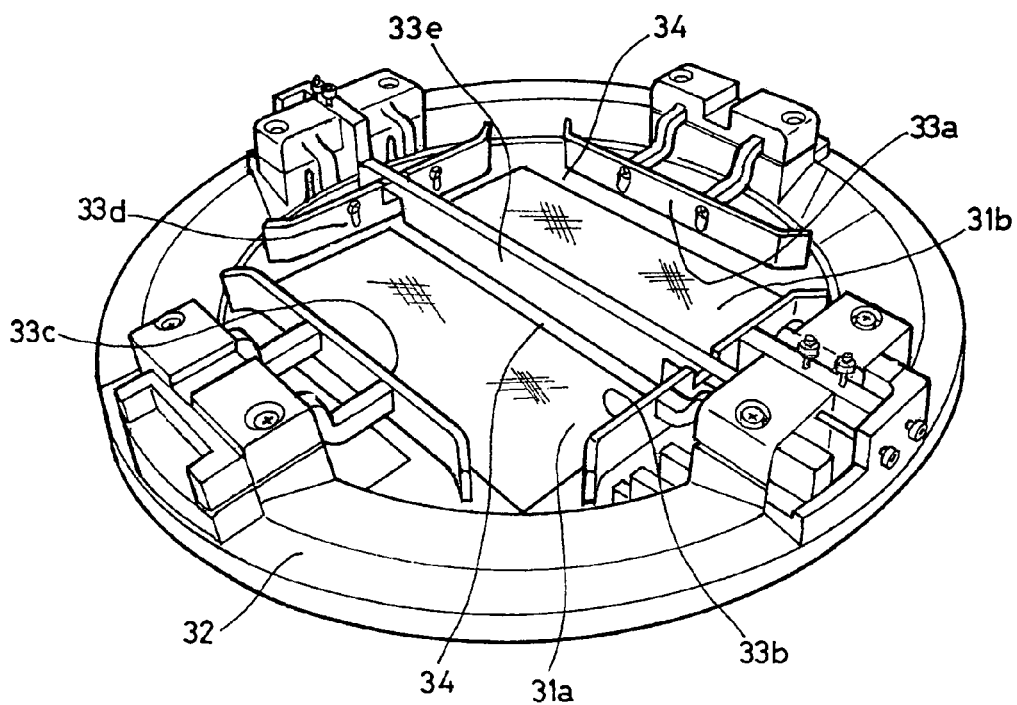

FIG_5
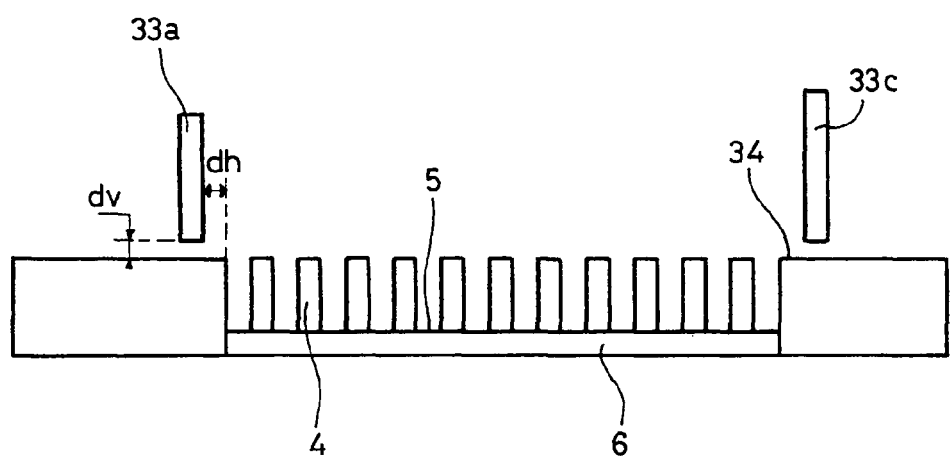

DEVICE FOR FABRICATING A MASK BY PLASMA ETCHING A SEMICONDUCTOR SUBSTRATE

CROSS-REFERENCE TO RELATED APPLICATIONS

This application is based on French Patent Application No. 0550002 filed Mar. 1, 2005, the disclosure of which is hereby incorporated by reference thereto in its entirety, and the priority of which is hereby claimed under 35 U.S.C. §119.

BACKGROUND OF THE INVENTION

1. Field of the Invention

The present invention relates to microlithography employing the electron projection lithography (EPL) technique that is used in particular to produce masks to be used in the fabrication of microelectronic components with submicron dimensions. The invention is intended to be used in particular to etch 65 nm to 45 nm patterns in semiconductor materials. The invention relates more particularly to a device used to fabricate a mask by plasma etching a semiconductor substrate, and in particular to monitoring the uniformity of the depth of etching and the uniformity of the corners of the patterns over the whole of the surface of the substrate.

2. Description of the Prior Art

Silicon substrates are currently micromachined using plasma etching techniques such as that described in the U.S. Pat. No. 5,501,893, which consists in partially protecting the silicon substrate by an etching mask and submitting the substrate partially protected in this way to an alternating succession of plasma etching steps using an etching gas and plasma passivating steps using a passivating gas. To fabricate the etching mask, a pattern to be etched is transferred onto the substrate from a transmission mask. The transfer is usually effected by the photolithographic technique of exposing the substrate to photonic radiation through the transmission mask. The transmission masks themselves are fabricated from d master mask that is usually produced by means of a very fine beam of electrons, with beam dimensions less than the smallest dimensions of the pattern to be obtained, controlled by computer means, which sweeps the surface of an electrosensitive resin substrate to draw the required pattern thereon. This kind of operation takes a very long time. The transmission masks are therefore produced by a different technique, for cost reasons in particular.

Semiconductor component miniaturization and complexity requirements have increased in recent years. Photolithography as used at present has reached its limit in terms of line resolution. Lithographic techniques are coming into use that employ shorter wavelengths, such as electron or ion beams and X-rays.

The masks employed when exposing semiconductor substrates to an electron beam generally take the form of an array in which small areas carrying the pattern to be etched are separated by an array of thicker so-called grillage areas. These small areas are on a thin membrane of the order of 2 μm thick. Examples of such masks are described in U.S. Pat. No. 6,352,802, for example. A beam of electrons having a section of the same order of magnitude as the small area projects onto the mask a reduced image of the patterns to be etched through the small areas onto the substrate intended to become a microelectronic component. To obtain a correct projected image of the mask, it is essential that the membrane constituting each of the small areas is of constant thickness.

It has been found that, when plasma etching transmission masks, the membrane is thicker at the edges of the mask than at the center. This defect leads to non-uniform exposure of the semiconductor substrate through the mask, which leads to unequal etching of the substrate and therefore the rejection of these products.

An object of the present invention is to propose a device and a method for obtaining a constant membrane thickness over the entire area of the transmission mask for use in electron beam microlithography during the fabrication thereof.

SUMMARY OF THE INVENTION

The present invention consists in a device for fabricating a mask by plasma etching a semiconductor substrate which comprises a semiconductor substrate part of the area whereof is partially covered by a mask for protecting at least one area that must not be etched and for exposing at least one area including a pattern to be etched, a support for the substrate and means for generating a plasma in the form of a flow of ions toward the substrate. According to the invention the device further comprises means for confining the ions, including a conductive material screen disposed over the substrate and along the limit between the pattern area to be etched and the area not to be etched, said screed taking the form of vertical plates parallel to each of the sides of said pattern area to be etched in the shape of a quadrilateral.

For improved efficacy, the screen is at a constant distance from the limit of said pattern area to be etched. The screen is disposed at a constant horizontal distance outside said limit so that it does not mask any portion of the pattern. The screen is therefore placed over the substrate vertically in line with the area that is not to be etched. The screen is preferably at a constant vertical distance from the substrate, leaving a gap between the screen and the substrate. The constant distance is preferably less than 10 mm. The height of the screen is preferably from 5 mm to 20 mm.

The substrate advantageously includes a plurality of areas including patterns to be etched separated from each other by areas that are not to be etched. A large number of patterns can be produced faster and at lower cost in this way. If the substrate includes a plurality of patterns to be etched, each area to be etched is surrounded by its own screen.

In order to prevent edge effects, the screen is preferably interrupted at the corners of the quadrilateral if that corner is at a distance from another pattern area to be etched less than or equal to the constant distance between the screen and the limit of the pattern area to be etched.

In one particular embodiment of the invention, in order to prevent edge effects, the screen is interrupted at the corners of the quadrilateral if the corner is at a distance from a conductive material part less than or equal to the constant distance between the screen and the limit of the pattern area to be etched.

The present invention has the advantage of confining the plasma radiation in an area corresponding exclusively to the area of the mask carrying the patterns that are to be etched, so as to ensure a vertical etching speed, for example of 3 μm/min±6%, that is uniform over the whole of the area of the substrate.

Other objects, features and advantages of the present invention will emerge from the following description of particular embodiments of the invention provided by way of illustrative and nonlimiting example, and from the appended drawings.

BRIEF DESCRIPTION OF THE DRAWINGS

FIG. 1 is a diagram representing the exposure of a semiconductor substrate to an electron beam through a transmission mask.

FIG. 2 is a perspective view of a transmission mask receiving a beam of electrons.

FIG. 3 is a diagram of the device of the present invention.

FIG. 4 is a perspective view of the device of the present invention.

FIG. 5 is a diagram in section taken along the line A-A in FIG. 3.

DETAILED DESCRIPTION OF THE PREFERRED EMBODIMENT

The FIG. 1 diagram shows a wafer 1 of a semiconductor substrate that is exposed to an electron beam 2 passing through a transmission mask 3. The mask 3 includes raised portions 4 separating small areas 5 of a thin membrane 6 carrying a pattern to be etched. The dimensions of the pattern carried by the mask are divided by approximately four when it is reproduced on the substrate.

FIG. 2 is a perspective view of the mask 3. It includes raised portions 4 with a depth p of 725 µm, for example. The small area 5 carrying the pattern to be etched is a square area with a side length of 1.13 mm, for example. The area 5 may further include holes with a diameter of 120 nm, for example. The membrane 6 has a thickness e of 2 µm, for example. An electron beam 2 is directed onto the mask 3. The beam 2 passes through the area 5 to reproduce the pattern that it carries on the substrate.

FIG. 3 is a diagram of the device 30 of the invention for fabricating masks by plasma etching a semiconductor substrate 31. The resulting masks take the form of two rectangular areas 31a and 31b of patterns etched in the substrate 31, for example, surrounded by an area 31c that has not been etched. The areas 31a and 31b have a length of 132.57 mm and a width of 54.43 mm, for example, and carry an array pattern.

The device 30 shown in FIGS. 3 to 5 includes a system 32 for retaining the substrate 31 to which are fixed means for confining ions, for example five plates 33a, 33b, 33c, 33d, 33e forming a screen, framing and separating the side-by-side pattern areas 31a and 31b.

The screen is of metal, preferably of aluminum, and formed of plates 33a-33e that are disposed at a small and constant distance dh, for example from 3 mm to 6 mm, from the limit 34 between the pattern areas 31a and 31b and the unetched area 31c. The plates 33a, 33e are therefore above the unetched area 31c, at a distance dv that may be from 3 mm to 6 mm, for example.

The plates 33a-33e are fixed to the system 32 for retaining the substrate 31 so that there is a gap between each plate and the substrate 31.

There is claimed:

1. A device for fabricating a mask by plasma etching a semiconductor substrate, said device comprising: a semiconductor substrate that is partially covered by a mask for protecting at least one area that must not be etched and for exposing at least one area including a pattern to be etched, a support for said substrate, and a disjointed conductive material screen disposed over said substrate and along a limit between said pattern area to be etched and said area not to be etched, at a constant vertical distance of the substrate, leaving a gap between the conductive material screen and a surface of the substrate and at a constant horizontal surface outside said limit, and taking the form of vertical plates parallel to each of the sides of said pattern area to be etched in the shape of a quadrilateral.

2. The device according to claim 1, wherein said screen is at a constant distance from the limit of the pattern area to be etched.

3. A device according to claim 2, wherein said screen is at a constant horizontal distance to the outside of the limit of said pattern area to be etched.

4. A device according to claim 2, wherein said screen is at a constant vertical distance from said substrate.

5. A device according to claim 2, wherein said constant distance is less than 10 mm.

6. A device according to claim 1, wherein the height of said screen is from 5 mm to 20 mm.

7. A device according to claim 1, wherein said substrate includes a plurality of areas including patterns to be etched separated from each other by areas not to be etched.

8. A device according to claim 7, wherein said screen is interrupted at the corners of said quadrilateral if said corner is at a distance from another pattern area to be etched less than or equal to said constant distance.

9. A device according to claim 1, wherein said screen is interrupted at the corners of said quadrilateral if said corner is at a distance from a conductive material part less than or equal to said constant distance.

10. A device according to claim 1, wherein said conductive material screen comprises metal.

11. A device according to claim 10, wherein said conductive material screen comprises aluminum.

12. The device according to claim 1, wherein said mask comprises a thin membrane that is partitioned by raised portions.

13. The device according to claim 12, wherein areas of the thin membrane between the raised portions comprise holes.

14. The device according to claim 1, wherein the conductive material screen is disposed over said pattern area to be etched.

15. The device according to claim 1, wherein said conductive material screen is attached to said support.

* * * * *